US012587788B2

(12) United States Patent
Alakuijala et al.

(10) Patent No.: US 12,587,788 B2
(45) Date of Patent: Mar. 24, 2026

(54) SPEAKER ARRAY ADDRESSED BY ROW AND COLUMN SELECTION

(71) Applicant: Google LLC, Mountain View, CA (US)

(72) Inventors: Jyrki Antero Alakuijala, Wollerau (CH); Matthew Sharifi, Kilchberg (CH); Martin Bruse, Tyreso (SE); Zoltan Szabadka, Gyorujbarat (HU); Thomas Fischbacher, Gattikon (CH); Sami Boukortt, Zurich (CH); Moritz Firsching, Basel (CH); Evgenii Kliuchnikov, Thalwil (CH)

(73) Assignee: Google LLC, Mountain View, CA (US)

( * ) Notice: Subject to any disclaimer, the term of this patent is extended or adjusted under 35 U.S.C. 154(b) by 160 days.

(21) Appl. No.: 18/538,452

(22) Filed: Dec. 13, 2023

(65) Prior Publication Data

US 2024/0205603 A1     Jun. 20, 2024

Related U.S. Application Data

(60) Provisional application No. 63/387,342, filed on Dec. 14, 2022.

(51) Int. Cl.
| | |
|---|---|
| *H04R 1/40* | (2006.01) |
| *H03F 3/217* | (2006.01) |
| *H04R 3/12* | (2006.01) |

(52) U.S. Cl.
CPC ............. *H04R 3/12* (2013.01); *H03F 3/2171* (2013.01); *H04R 1/403* (2013.01); *H03F 2200/03* (2013.01); *H03F 2200/351* (2013.01); *H04R 2201/401* (2013.01); *H04R 2201/403* (2013.01); *H04R 2430/20* (2013.01)

(58) Field of Classification Search
CPC .... H04R 3/12; H04R 1/403; H04R 2201/401; H04R 2201/403; H04R 2430/20; H04R 29/001; H04R 29/002
USPC ...................................... 381/77–82, 120, 123
See application file for complete search history.

(56) References Cited

U.S. PATENT DOCUMENTS

| | | | | |
|---|---|---|---|---|
| 7,058,463 | B1 * | 6/2006 | Ruha ...................... | H04R 1/005 |
| | | | | 330/251 |
| 7,702,120 | B1 | 4/2010 | Ferstenberg | |
| 7,940,938 | B2 * | 5/2011 | Miki ........................ | H04R 3/12 |
| | | | | 700/94 |
| 12,021,491 | B2 * | 6/2024 | Mallinson ............... | H03F 3/185 |
| 2004/0131193 | A1 * | 7/2004 | Kitamura .................. | H03F 1/32 |
| | | | | 381/28 |

(Continued)

*Primary Examiner* — Disler Paul
(74) *Attorney, Agent, or Firm* — Brake Hughes Bellermann LLP

(57)     ABSTRACT

Spatial audio may be generated by a speaker array that is switched according to rows and/or columns to reduce its cost and complexity. The speaker array may include a row of speakers that are each coupled to a different column channel. The rows of speakers can receive portions of the spatial audio on a row-by-row basis as each row is activated to couple the speakers in a row to their respective column. This switched approach reduces a number of required audio sources. The audio sources may generate PWM signals for each column using an approach that is similar to that found in Class-D amplification or sigma-delta Modulation. Analog signals may be recovered from the PWM signals using a low-pass filter positioned before each speaker in the array.

15 Claims, 9 Drawing Sheets

(56)                    References Cited

U.S. PATENT DOCUMENTS

| | | | |
|---|---|---|---|
| 2006/0251197 A1* | 11/2006 | Zaucha .................. | H04S 3/008 |
| | | | 375/350 |
| 2008/0226093 A1* | 9/2008 | Kushida .................. | H04R 3/12 |
| | | | 381/77 |
| 2013/0108078 A1 | 5/2013 | Ma | |
| 2014/0203870 A1 | 7/2014 | Williams | |
| 2017/0366895 A1* | 12/2017 | Risberg ................. | H04R 1/403 |
| 2020/0374624 A1 | 11/2020 | Koschak et al. | |
| 2023/0292029 A1* | 9/2023 | Alam ...................... | H02J 50/10 |
| 2023/0412979 A1* | 12/2023 | Yoshioka ................ | H04R 3/04 |

* cited by examiner 820      810

900

Generating an analog signal for a speaker in an array of speakers — 910

Modulating the analog audio signal to obtain a digital audio signal — 920

Selecting the speaker in the array — 930

Coupling the digital audio signal to the speaker — 940

Filtering the digital audio signal to recover the analog audio signal — 950

Playing the analog audio signal on the speaker — 960

SPEAKER ARRAY ADDRESSED BY ROW AND COLUMN SELECTION

CROSS-REFERENCE TO RELATED APPLICATION

This application claims the benefit of U.S. Provisional Application, No. 63/387,342, filed on Dec. 14, 2022, which is hereby incorporated by reference in its entirety.

FIELD OF THE DISCLOSURE

The present disclosure relates to a speaker array and more specifically to a speaker array addressed by row and column selection.

BACKGROUND

An array of speakers may be configured to generate sounds that combine to provide a listener with a sense of a location of the source of the sound in a virtual environment. The realism of the virtual sound localization may be increased by increasing a number of speakers in the array.

SUMMARY

Speakers in a speaker array can be sequentially switched individually, or in groups, to an audio source to receive audio signals (e.g., digital audio). The audio signal for each speaker can be adjusted (e.g., in phase, amplitude) so that when spatially combined at an ear of a user, a perception that the audio originated from a location in a virtual environment is created. The switching may be imperceptible when the rate of switching is high and can allow for the system to be simplified, thereby saving cost and complexity.

In some aspects, the techniques described herein relate to a speaker array including: a plurality of driver circuits arranged in an array, each of the plurality of driver circuits including a low-pass filter coupled to a speaker; an array circuit including at least one row channel, a plurality of column channels, and a plurality of row-select switches coupled between the plurality of driver circuits and the plurality of column channels; at least one audio source coupled to the plurality of column channels, the at least one audio source configured to generate pulse width modulated (PWM) signals corresponding to spatial audio; and a controller configured to: transmit row-select signals to the row-select switches on a row-by-row basis to enable each row of speakers to receive the PWM signals from the at least one audio source.

In some aspects, the techniques described herein relate to a method for generating spatial audio, the method including: generating an analog audio signal for a speaker in an array of speakers; modulating the analog audio signal to obtain a digital audio signal; selecting the speaker in the array; coupling the digital audio signal to the speaker; filtering the digital audio signal to recover the analog audio signal; and playing the analog audio signal on the speaker.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

As the market for speakers for electronics increases (e.g., mobile speakers) and as processing capabilities become more powerful (e.g., tensor processing unit), opportunities may exist for practically implementing audio waveform synthesis to create realistic and immersive audio environments for a user. For example, a home audio system may include an array of speakers configured to present spatial audio to a user that is perceived as originating from a location approximately as it would appear to originate in a real environment.

The spatial audio may become more realistic (e.g., more accurate) as a number of speakers in the speaker array increases. A technical problem with increasing the number of speakers is the cost of the electronics necessary for providing audio to the speakers individually. A speaker array is disclosed that can reduce a number of audio circuits by sequentially addressing a speaker, or group of speakers, with the same audio source (or audio sources). The resulting speaker array system may have the technical advantage of having a lower cost than other approaches and therefore may be more practical for consumer applications.

Figure 1:
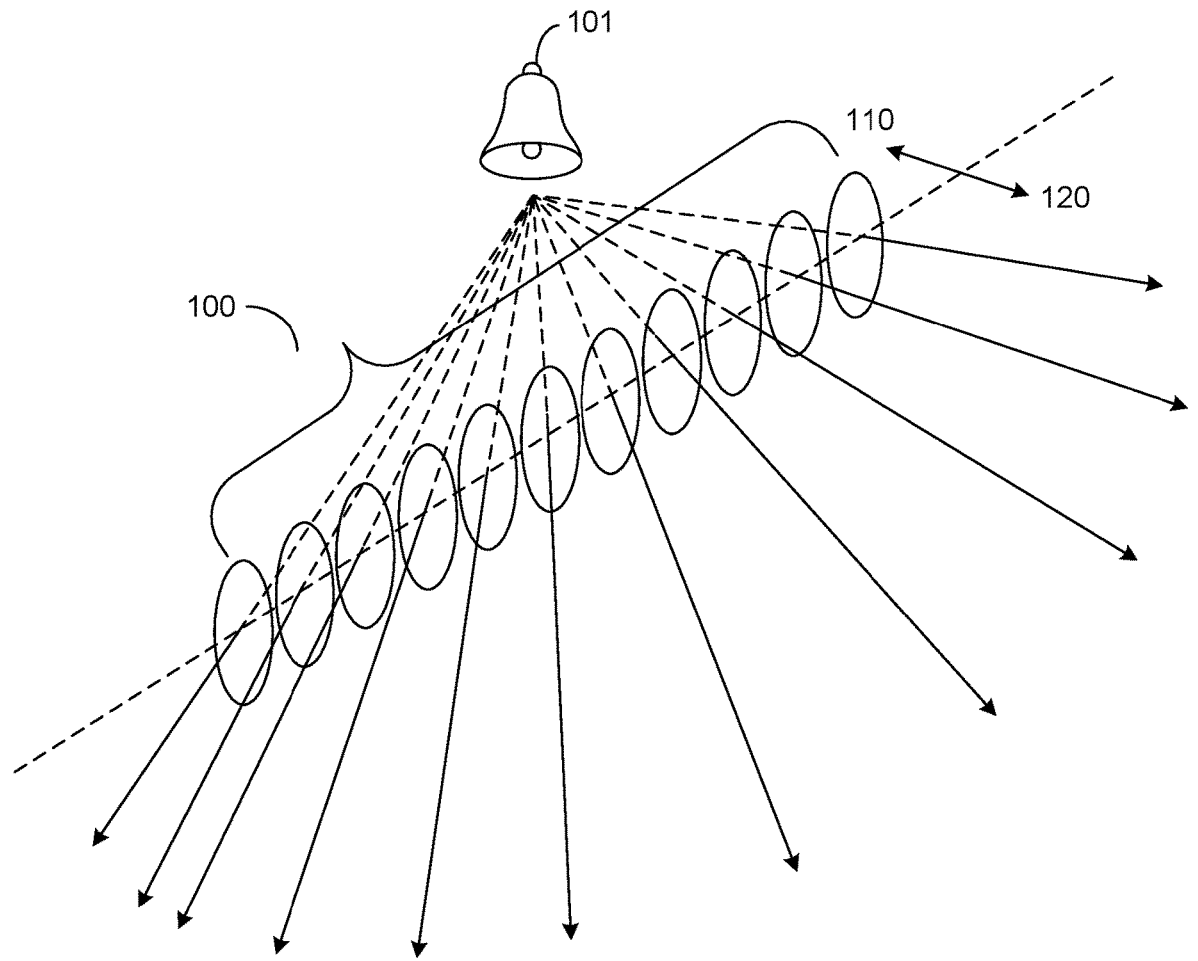
FIG. 1 is a perspective view of spatial audio generated by an array of speakers according to a possible implementation of the present disclosure.

FIG. 1 is a perspective view of spatial audio generated by an array of speakers according to a possible implementation of the present disclosure. As shown a virtual sound source (e.g., virtual bell) creates a bell sound in a virtual environment 110 having a virtual wavefront, which may be represented by the dotted lines, as shown in the FIG. 1. Speakers in an array of speakers (i.e., speaker array 100) may each be driven (i.e., excited) with an audio signal corresponding to the bell sound having an amplitude (k) and phase (φ) related to where each speaker in the speaker array 100 intersects the virtual wavefront. In other words, speakers closer to the virtual bell 101 will be excited with the bell sound before speakers further away from the virtual bell 101. The speakers, in combination, will create a real bell sound in a real environment 120 having a real wavefront, which may be represented by solid lines, as shown in FIG. 1. Accordingly, a listener may receive the real wavefront and hear the real bell sound generated by the speaker. The user can perceive the sound as originating from the position of the virtual bell in the virtual environment.

The rendered wavefront generated by the array of speakers may be referred to as spatial audio, and the quality of the spatial audio may be associated with its ability to be perceived as the virtual sound source in the virtual location. The quality of the spatial audio may increase with a number of speakers in the array. Further, spatial audio created by a one-dimensional (1D) array may be able to represent the location of the virtual source in one-dimension (i.e., in a direction along the array), spatial audio created by a two-dimensional (2D) array may be able to represent the location of the virtual source in two-dimensions (i.e., in a plane defined by the array), and spatial audio created by a three-dimensional (3D) array may be able to represent the location of the virtual source in three-dimensions (i.e., in a volume defined by the array). The techniques disclosed herein may be applied to 1D, 2D, or 3D speaker arrays.

Figure 2:
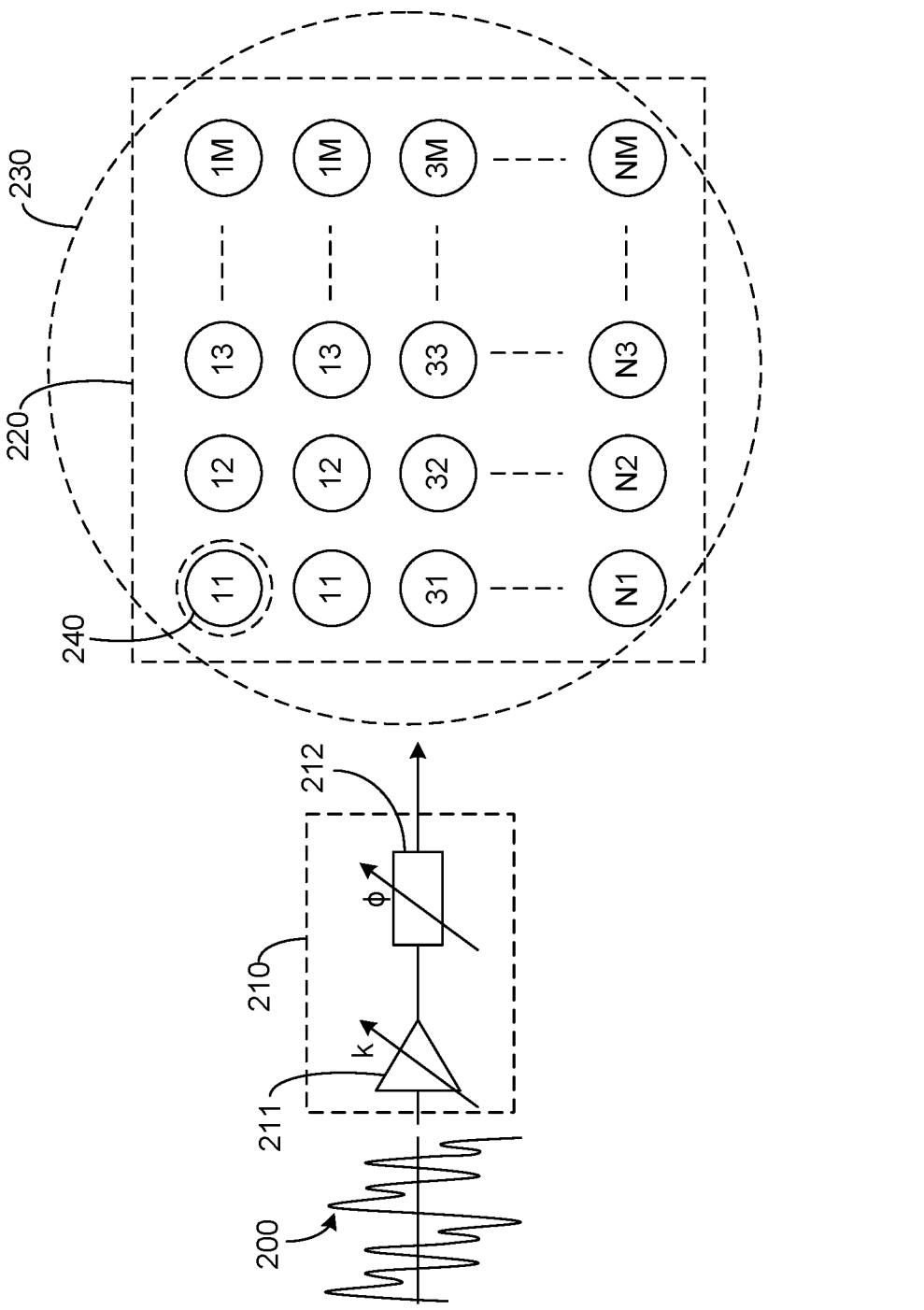
FIG. 2 is a system block diagram of a spatial audio system according to a possible implementation of the present disclosure.

FIG. 2 is a system block diagram of a spatial audio system according to a possible implementation of the present disclosure. The spatial audio system may receive an audio signal 200. The audio signal 200 can be processed by an audio processor 210. Each speaker in a speaker array may receive a processed audio stream from the audio processor 210. Accordingly, the audio processor may include an amplifier 211 (or attenuator) that can be adjusted to control an amplitude (k) of the audio signal 200 according to the location of the virtual sound source relative to a particular speaker in the array. The audio processor 210 may further include a phase-shifter 212 that can be adjusted to control a phase (ϕ) of the audio signal 200 according to a location of the virtual sound source relative to a particular speaker in the array.

The array may be a 2D planar array that includes a plurality of loudspeakers arranged in rows (e.g., 11, 12, 13, . . . , 1M) and columns (e.g., 11, 21, 31, . . . , N1) to form a square layout 220, as shown in FIG. 2, but other variations may be implemented. In one possible variation, a single speaker membrane 230 (e.g., cone) can be actuated by an array of drivers (11, 12, . . . NM) positioned over a surface of the membrane. The array of drivers may be actuated independently to achieve substantially the same wavefront as would be generated by an array of discrete membranes 240 (e.g., cones), which are each driven by a dedicated driver. In another variation, the speakers are arranged in a layout that is not square (e.g., rectangular, circular, L-shaped, annulus, etc.). For example, an array of speakers may be positioned in a frame around a display. In another variation, an area defined by the array of speakers (i.e., layout shape) does not match the shape defined by the circuit of interconnections (i.e., array shape). For example, speakers in a linear layout may be addressed as according to a grid array circuit, and vice versa.

Returning to FIG. 2, driving each of the speakers in the array simultaneously would require (at least) an audio processor 210 for each speaker. Additionally, while each speaker may require an analog signal it may be desirable to perform the audio processing digitally. Either or both of these requirements can be cost prohibitive for large arrays. Instead, the disclosed speaker array uses a row-column addressing approach for time multiplexing signals (audio streams) provided to each speaker in the speaker array. The time multiplexing may be imperceptible to a listener when it is at a sufficiently high rate (e.g., >250 KHz). The multiplexed approach can reduce a number of the circuits and/or devices necessary to carry out the processing for each speaker. For example, one audio processor 210 may be used for each column and the rows may be switched to enable and disable (e.g., connect and disconnect) speakers in the rows in order to provide audio streams to speakers.

Figure 3:
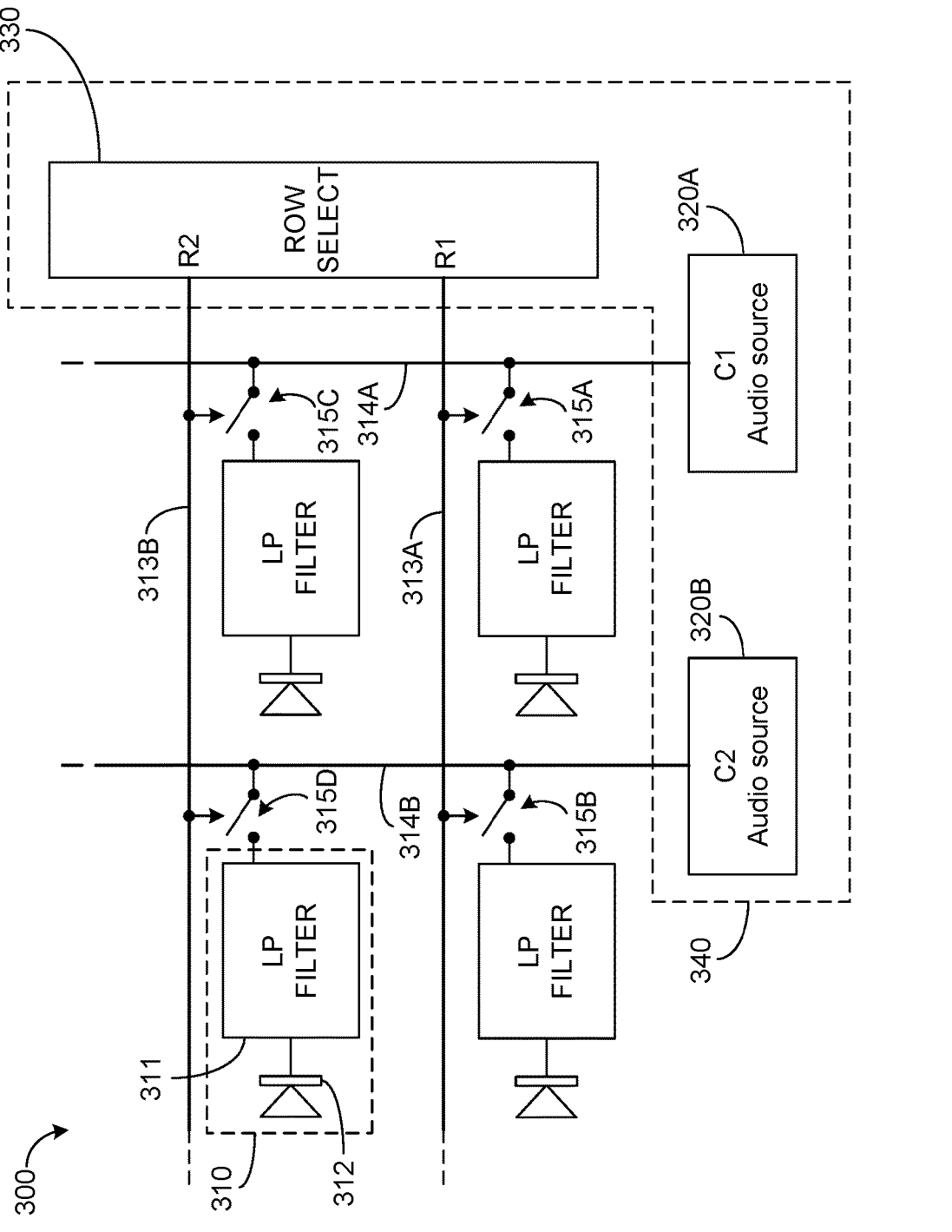
FIG. 3 is a schematic block diagram of a speaker array according to a first possible implementation of the present disclosure.

FIG. 3 is a schematic block diagram of a speaker array according to a first possible implementation of the present disclosure. The speaker array 300 includes a plurality of driver circuits 310, which can be the same in that they include devices having the same specifications. Each driver circuit 310 can include a low-pass filter (LP filter 311) and a speaker 312. The speakers are positioned to broadcast sounds into an environment of a listener and may be any type of electrically actuated transducer configured to convert an electric signal into a sound signal. Actuating a speaker to make a sound according to an electrical signal may be referred to herein as playing the sound on the speaker. The LP filter 311 can be configured to convert a digital (i.e., binary level, tri-level) modulated audio signal (i.e., digital audio signal) into an analog signal that can actuate the speaker to create a sound. The LP filter 311 may have a cutoff frequency chosen to remove high-frequency signals above a human hearing range.

The speaker array 300 further includes an array circuit having a plurality of row channels 313A, 313B (i.e., row conductors) and a plurality of column channels 314A, 314B (i.e., column conductors). Each driver circuit 310 is coupled to a column channel by a row-select switch 315A, 315B, 315C, 315D. The row channels 313A, 313B are configured to convey row-select signals to the row-select switches on a row-wise basis. The row-select signals may be switching signals having a high level (HIGH) and a low level (LOW). The level of a row-select signal can control an ON/OFF condition of a row-select switch. For example, a HIGH first row-select signal (R1) can activate (close, turn-ON) row-select switches 315A, 315B, while a LOW row-select signal (R2) can deactivate (open, turn-OFF) row-select switches 315C, 315D of a second row. The rows select signals (R1, R2) may be generated by a row select circuit 330 controlled by a controller 340. For example, the row select circuit 330 may be pins of a controller 340 that can be actuated HIGH/LOW to control the row-select switches. The rows may be controlled row-wise so that only one row is active at any given time. For example, rows may be activated one row at a time from a first row to a last row. This sequence may be repeated so that each row is actuated (i.e., selected) in a repeating cycle.

The speaker array 300 may include any number of rows and columns. such as 16 rows and 8 columns. Each column may be coupled to an audio source for the column channel. Thus, while the example speaker array can have 128 speakers it may only require 8 audio sources. Returning to FIG. 3, the speaker array may include a plurality of audio sources configured to generate a digital audio signal (i.e., digital audio) for the column channel. For example, a first audio source 320A may generate a first digital audio signal (C1) for a first column channel 314A and a second audio source 320B may generate a second digital audio signal (C2) for a second column channel 314B. The first audio source 320A and the second audio source 320B may transmit simultaneously or sequentially.

The digital audio signals and the row select signals may be controlled by a controller 340 so that during cycles of the repeating sequence, each speaker plays a portion of a sound that combines to generate the rendered wavefront described above. For example, during each cycle a speaker may be actuated according to a 32-bit digital sample of an audio signal. Accordingly, the controller may include processing (e.g., a tensor processing unit) configured to determine digital audio streams for each speaker, multiplex the digital audio streams according to columns and rows (i.e., an address) of each speaker, and control the row-select signals to couple the drivers to the audios sources to receive the multiplexed digital audio stream.

Figure 4:
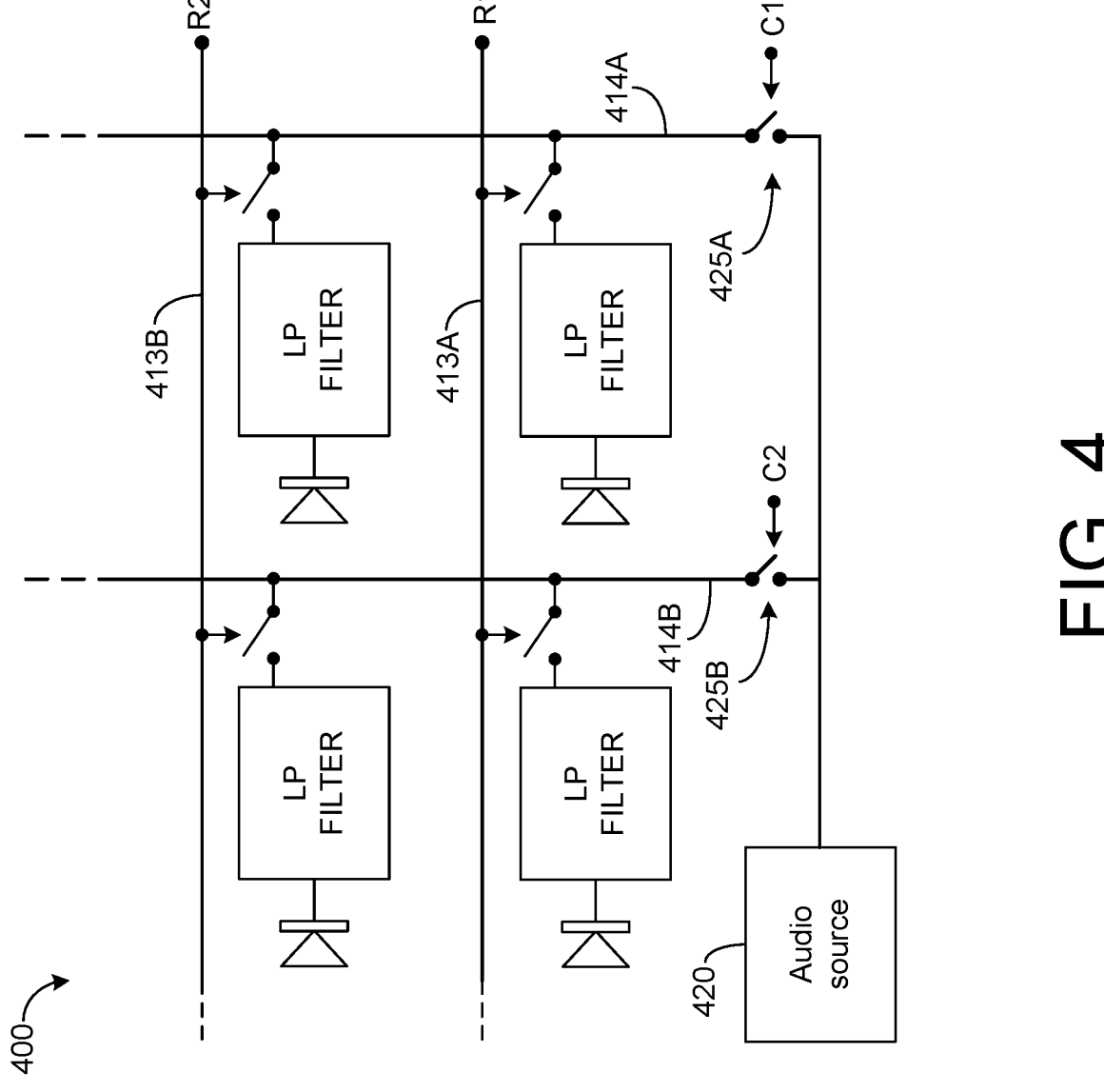
FIG. 4 is a schematic block diagram of a speaker array according to a second possible implementation of the present disclosure.

FIG. 4 is a schematic block diagram of a speaker array 400 according to a second possible implementation of the present disclosure. The implementation is similar to the implementation of FIG. 3, but the first column channel 414A and the second column channel 414B are coupled to an audio source 420 by column-select switches 425A and 425B. In this implementation only a single audio source is necessary because during a cycle the drivers may be coupled row-wise by row-select signals (R1, R2) transmitted on row channels 413A, 413B and column-wise by column-select signals (C1,C2) transmitted by a column select circuit (not shown).

While it may be possible for the audio source (or audio sources) to generate analog audio, it may be desirable for the audio source to generate digital audio signals. For example, generating digital audio signals may simplify the speaker array. The digital audio referred to herein is a signal having levels (e.g., two-levels, three-levels) that are modulated so that when the signal is low pass filtered an analog signal corresponding to a sound is generated. This digital signal may be generated using circuits that are similar to circuits used in power electronics and signal conversion.

In a first possible implementation, an audio source may be configured to operate similarly to a Class-D amplifier to generate a first pulse width modulated (PWM) digital signal that can be low-pass filtered to recover an analog signal. The first PWM signal may have a bandwidth corresponding to a highest frequency at which the PWM signal is switched from HIGH to LOW and vice versa (i.e., the switching frequency). Accordingly, the LP filter may have a cutoff frequency below a switching frequency of the PWM signal.

Figure 5:
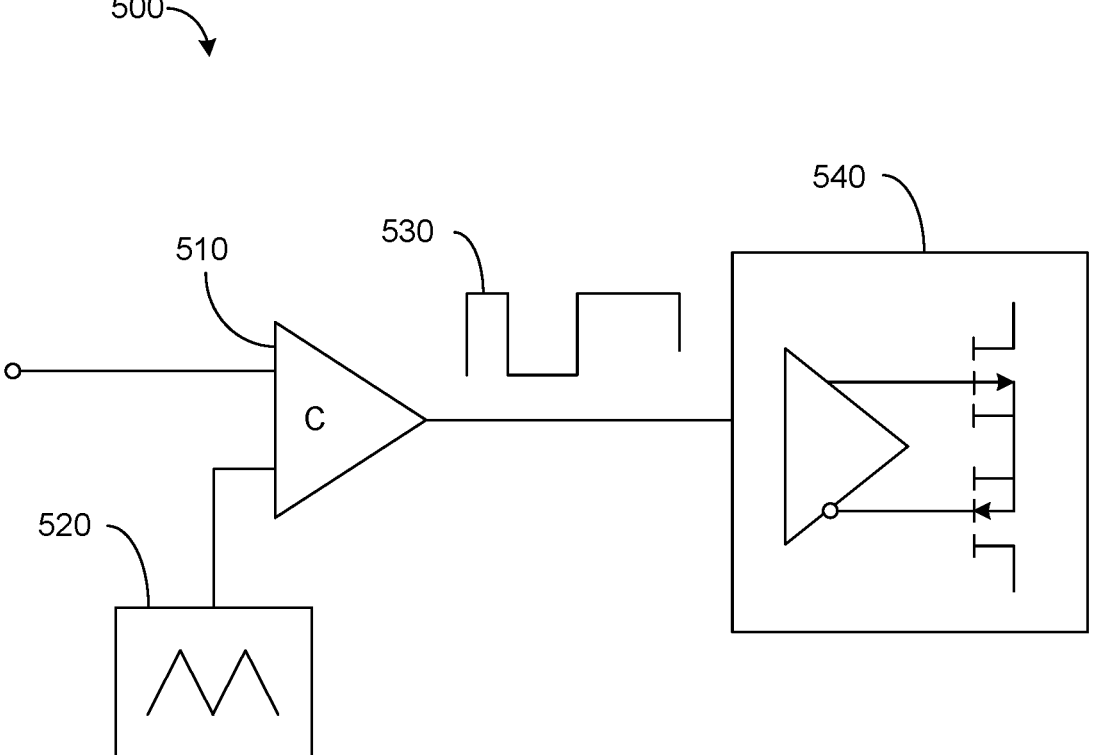
FIG. 5 is a schematic of an audio source for a speaker array according to a first possible implementation of the present disclosure.

FIG. 5 is a schematic of an audio source for a speaker array according to the first possible implementation described above. The audio source 500 includes a comparator 510 that is configured to receive an analog audio signal at a first input and a triangle wave from a triangle wave generator 520 at a second input. The comparator 510 outputs a first PWM signal 530 in which a pulse width is modulated according to the input analog audio signal (i.e., according to its amplitude). The first PWM signal 530 may be amplified and transformed to a high-power regime using a half-bridge circuit 540. The output of the half-bridge circuit 540 can be the digital audio coupled to a column channel. The triangle wave generator 520 may define a row-selection frequency. For example, the frequency of the triangle wave (e.g., 500 KHz) may equal the rate at which rows are switched in the speaker array.

In a second possible implementation, the audio source may be configured to operate like a sigma-delta modulator configured to convert an analog audio signal into a second PWM signal representing the analog audio signal.

Figure 6:
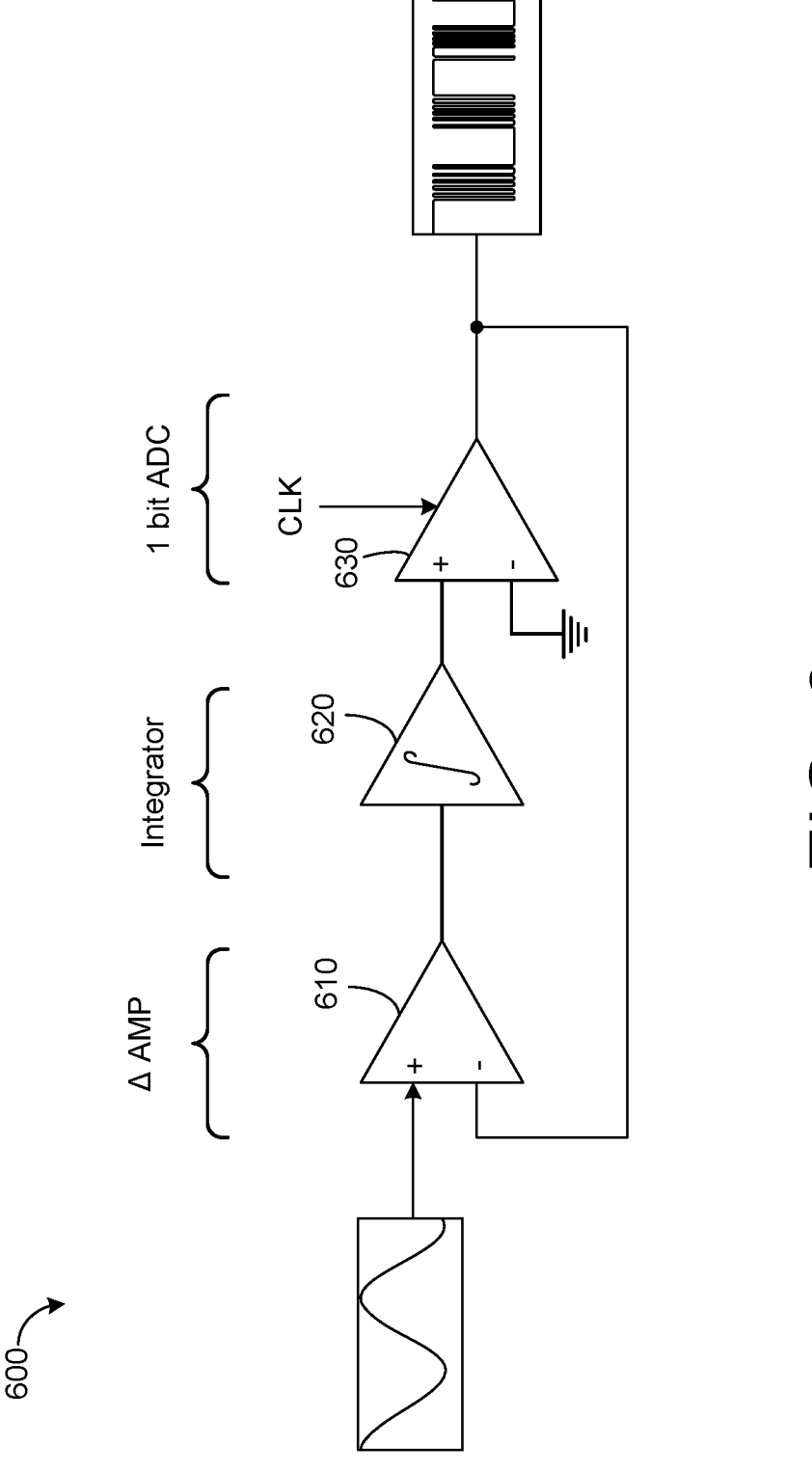
FIG. 6 is a schematic of an audio source for a speaker array according to a second possible implementation of the present disclosure.

FIG. 6 is a schematic of an audio source for a speaker array according to the second possible implementation described above. The audio source 600 includes a difference amplifier 610 configured to receive an analog audio signal at a first input and a feedback signal at a second input. The difference amplifier outputs a signal having an amplitude corresponding to how much the input signal has changed since a previous clock (CLK) cycle. The audio source 600 may further include an integrator 620 configured to change its output signal at a rate corresponding to the output of the difference amplifier. The audio source 600 further includes 1-bit ADC that can include a comparator with a clocked output. The 1-bit ADC 630 outputs a second PWM signal in which a pulse rate is modulated according to the input analog audio signal (i.e., according to its rate of change).

Figure 7:
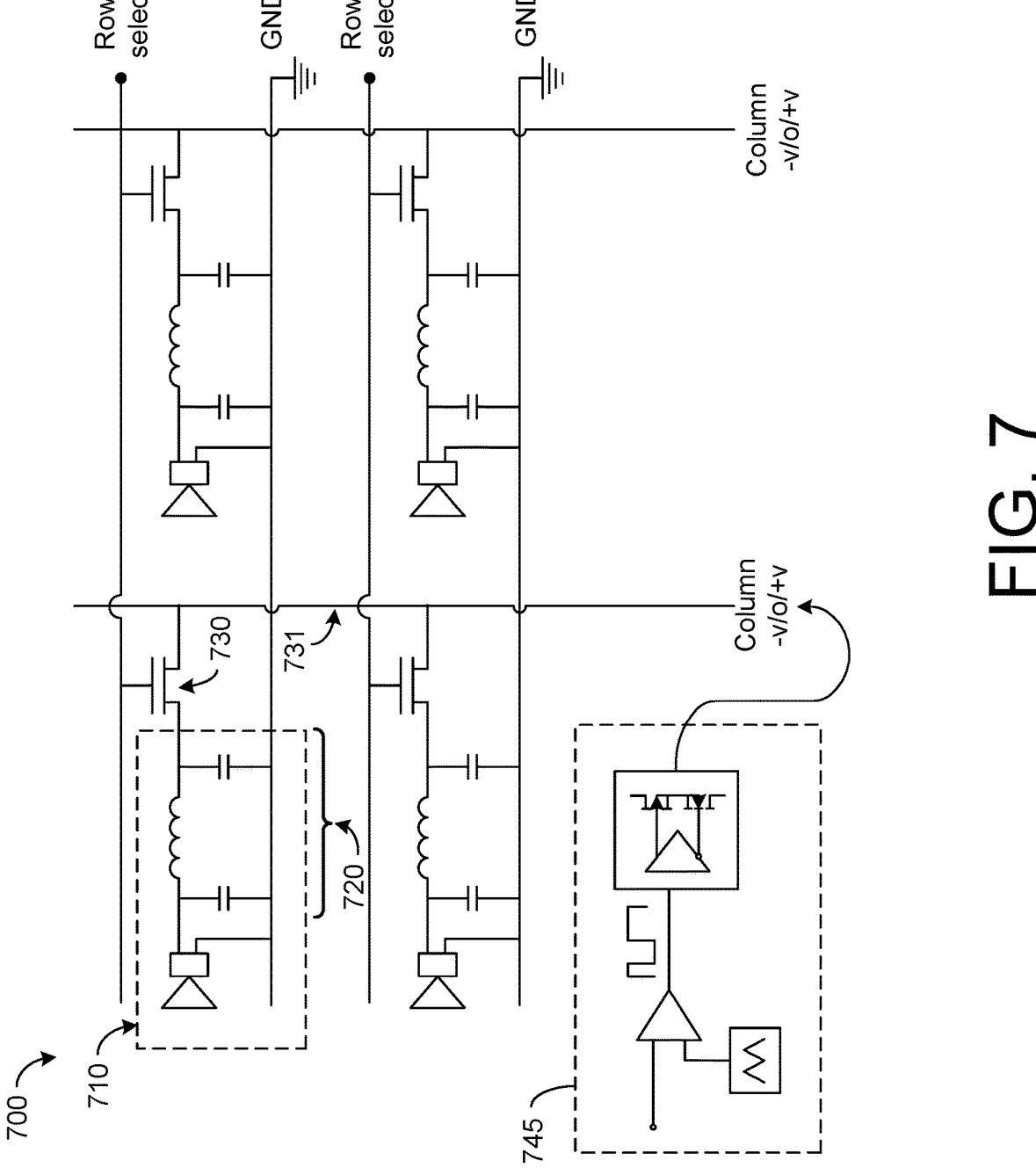
FIG. 7 is a detailed schematic of a speaker array system for rendering spatial audio according to an implementation of the present disclosure.

FIG. 7 is a detailed schematic of a speaker array system for rendering spatial audio according to an implementation of the present disclosure. The speaker array in the speaker array system 700 is similar to the implementation shown in FIG. 2. As shown, a driver circuit 710 includes a low-pass filter implemented as a low-pass pi-filter 720 that includes an inductor coupled between an input coupled to a row-select switch 730 and an output coupled to a speaker 740. The low-pass pi-filter 720 further includes a first capacitor coupled between the input and a ground and a second capacitor coupled between the output and the ground. The row-select switch 730 is implemented as a metal oxide semiconductor field effect transistor (i.e., MOSFET) that is coupled at a gate terminal (i.e., gate) to a row. A row-select signal at the gate can cause a source-drain conduction channel in the MOSFET that couples the input of the low-pass pi-filter 720 to the column channel 731. The column channel 731 can conduct a PWM signal from the audio source 745 for the column to the row-select switch 730. It should be noted that the PWM signal may be a tri-level signal or a binary signal (±V). For example, the PWM signal may be a tri-level signal having a negative voltage (−V) level, a zero level (0), and a positive voltage (+V) level.

The speaker array may be part of a speaker array system used for home and/or theater entertainment. For example, the speaker array may be a planar one-dimensional (e.g., planar) array of speakers in a sound bar for a television. In another example, the speaker array may be a two-dimensional (e.g., planar) array of speakers surrounding a display. In another example, the speaker array may be a two-dimensional (e.g., planar) array of speakers positioned behind a screen configured to display images projected on the screen, where the array of speakers may be a size comparable to the screen.

Figure 8:
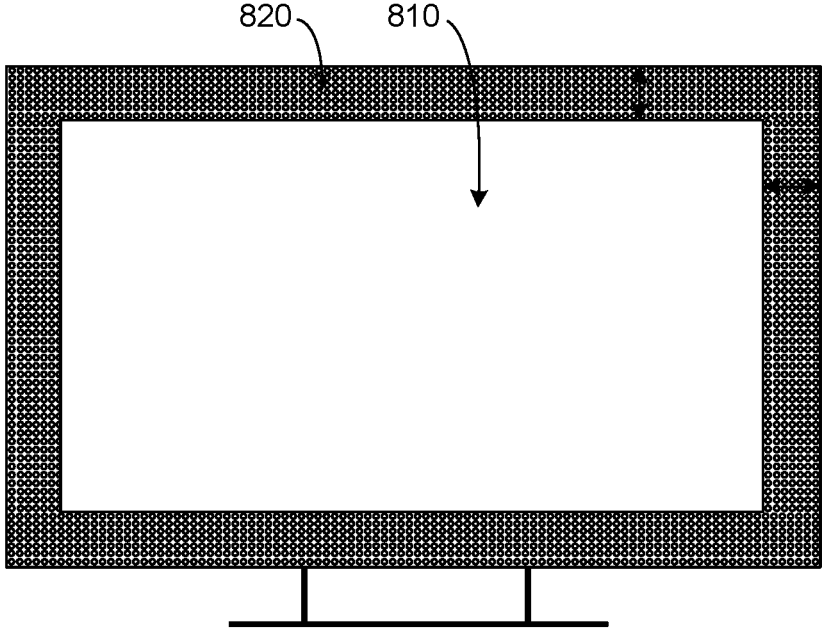
FIG. 8 is a front view of a television including a speaker array system for rendering spatial audio according to an implementation of the present disclosure.

FIG. 8 is a front view of a television including a speaker array system for rendering spatial audio according to an implementation of the present disclosure. As shown, the speakers in the speaker array can be positioned in an area (i.e., frame 820) surrounding a display 810 of the television.

Figure 9:
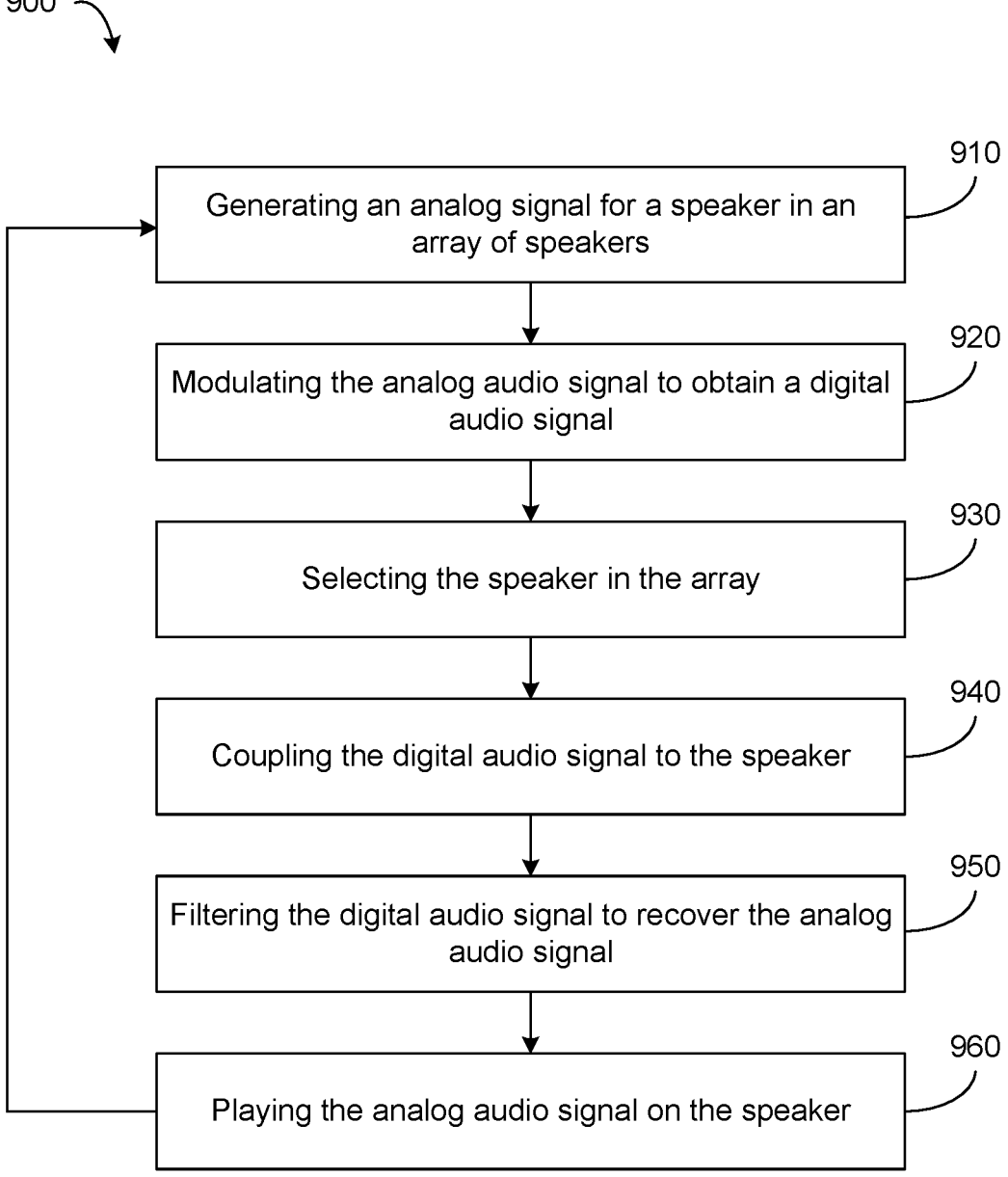
FIG. 9 is a flowchart of a method for generating spatial audio according to an implementation of the present disclosure.

FIG. 9 is a flowchart of a method for generating spatial audio according to an implementation of the present disclosure. The method may be carried out using a controller including a processor that is configured by code/programs/applications recalled from a non-transitory computer readable memory. The method 900 includes generating 910 an analog audio signal for a speaker in an array of speakers. The method 900 further includes modulating 920 the analog audio signal to obtain a digital audio signal. For example, the analog audio may be applied (i.e., input) to a PWM circuit for a class-D amplifier to generate a PWM signal as the digital signal. Alternatively, the analog audio may be applied to a pulse generation circuit for a sigma-delta modulator to generate the PWM signal. The method 900 further includes selecting 930 the speaker in the speaker array. For example, a row-select signal may be used to select the row of the speaker and a column-select signal may be used to select the column of the speaker. The method 900 further includes coupling 940 the digital audio signal to the speaker. For example, transistors controlled by the row-select signal may couple a row of speakers in the array to column channels to receive digital audio signals from the column channels. The method 900 further includes filtering 950 the digital audio signal to recover the analog signal. For example, a low-pass filter having a cutoff frequency lower than a PWM frequency of the digital audio signal may be used to attenuate high- frequencies so that only the analog sound signal remains significant. The method 900 further includes playing 960 the analog audio signal on the speaker. The above-mentioned process may be repeated for each speaker in the array. For example, a spatial audio cycle may include the process repeated for each speaker. The spatial audio cycle may then be repeated according to samples in the audio signal in order to generate the spatial audio.

In a possible implementation, the method of FIG. 9 is for a first speaker, a first analog audio signal, a first digital audio signal and the method can be repeated for other speakers and other analog audio signals. For example, the method can further include generating a second analog audio signal for a second speaker in the array of speakers; modulating the second analog audio signal to obtain a second digital audio signal; selecting the second speaker in the array; coupling the second digital audio signal to the second speaker; filtering the second digital audio signal to recover the second analog audio signal; and playing the second analog audio signal on the second speaker.

In a possible implementation of the method the array of speakers is a two-dimensional planar array of speakers arranged around a screen.

In a possible implementation of the method, the digital audio signal is a PWM signal. The PWM signal may vary between a lower voltage level (e.g., a ground, negative voltage) and a higher voltage level (e.g., a positive voltage). The PWM signal may alternate between the lower voltage level and the higher voltage level at a switching frequency. Accordingly, the filtering operation of the method described above may include filtering the digital audio signal to attenuate frequencies above the switching frequency.

In a possible implementation of the method, modulating the analog audio signal to obtain the digital audio signal can include applying the analog audio signal to a PWM circuit for a class-D amplifier.

In a possible implementation of the method, modulating the analog audio signal to obtain the digital audio signal can include applying the analog audio signal to pulse generation circuit for a sigma-delta modulator.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subse- quently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using vari- ous semiconductor processing and/or packaging techniques. Some implementations may be implemented using various types of semiconductor processing techniques associated with semiconductor substrates including, but not limited to, for example, Silicon (Si), Gallium Arsenide (GaAs), Gal- lium Nitride (GaN), Silicon Carbide (SiC) and/or so forth.

While certain features of the described implementations have been illustrated as described herein, many modifica- tions, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combi- nations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adja- cent can include laterally adjacent to or horizontally adjacent to.

What is claimed is:

1. A speaker array comprising:
a plurality of driver circuits arranged in an array, each of the plurality of driver circuits including a low-pass pi-filter coupled to a speaker, the low-pass pi-filter having a cutoff frequency to remove signals above a human hearing range so that an output of the low-pass pi-filter is an analog audio signal;

an array circuit including at least one row channel, a plurality of column channels, and a plurality of row-select switches coupled between the plurality of driver circuits and the plurality of column channels;

at least one audio source coupled to the plurality of column channels, the at least one audio source configured to generate pulse width modulated (PWM) digital signals corresponding to spatial audio; and a controller configured to transmit row-select signals to the plurality of row-select switches on a row-by-row basis to enable each row of driver circuits to receive the PWM digital signals from the at least one audio source.

2. The speaker array according to claim 1, wherein the at least one audio source includes:

a plurality of audio sources individually coupled to the plurality of column channels.

3. The speaker array according to claim 1, wherein the at least one audio source includes:

one audio source coupled to each of the plurality of column channels by a plurality of column-select switches that are controlled column-wise by column-select signals at the plurality of column channels.

4. The speaker array according to claim 1, wherein:

the plurality of row-select switches are each metal oxide semiconductor field effect transistors coupled at a gate terminal to a row channel of the array circuit.

5. The speaker array according to claim 1, wherein:

the low-pass pi-filter includes an inductor coupled between an input and the output, a first capacitor coupled between the input and a ground, and a second capacitor coupled between the output and the ground.

6. The speaker array according to claim 1, wherein:

the at least one audio source is a PWM circuit for a class-D amplifier configured to convert the spatial audio into the PWM digital signals and the low-pass pi-filter of a respective driver circuit is configured to convert one of the PWM digital signals into the analog audio signal for actuating the speaker of the respective driver circuit.

7. The speaker array according to claim 6, wherein:

the cutoff frequency is below a switching frequency of the PWM digital signals.

8. The speaker array according to claim 1, wherein:

the at least one audio source is a pulse generation circuit for a sigma-delta modulator configured to convert the spatial audio into the PWM digital signals and the low-pass pi-filter of a respective driver circuit is configured to convert one of the PWM digital signals into the analog audio signal for actuating the speaker of the respective driver circuit.

9. The speaker array according to claim 8, wherein:

the cutoff frequency is below a switching frequency of the PWM digital signals.

10. The speaker array according to claim 1, wherein the array is a planar, two-dimensional array.

11. The speaker array according to claim 1, wherein the array is a planar, one-dimensional array.

12. The speaker array according to claim 1, wherein the speaker array is included in a sound bar for a television.

13. The speaker array according to claim 1, wherein the speaker array is included in a television and is configured to surround a display of the television.

14. A method, comprising:

transmitting row-select signals to a plurality of row-select switches in a row channel of a speaker array to configure the plurality of row-select switches to couple a row of driver circuits in the speaker array to column channels of the speaker array, each driver circuit in the row of driver circuits including a low-pass pi-filter coupled at an input to a row-select switch and coupled at an output to a speaker;

enabling audio sources coupled to the column channels of the speaker array to transmit pulse width modulated (PWM) digital signals to the row of the driver circuits, the PWM digital signals corresponding to spatial audio;

converting a respective PWM digital signal at each driver circuit into a respective analog audio signal using the low-pass pi-filter; and actuating the speaker at each driver circuit based on the respective analog audio signal.

15. The method according to claim 14, wherein the low-pass pi-filter includes:

an inductor coupled between the input and the output;

a first capacitor coupled between the input and a ground; and a second capacitor coupled between the output and the ground.

* * * * *